United States Patent [19]

Mydill et al.

[11] Patent Number: 5,025,205
[45] Date of Patent: Jun. 18, 1991

[54] RECONFIGURABLE ARCHITECTURE FOR LOGIC TEST SYSTEM

[75] Inventors: Marc R. Mydill, Garland; Sam R. Pile, Dallas; Sheila O'Keefe, Garland; Neal F. Okerblom; W. Russ Keenan, both of Dallas, all of Tex.

[73] Assignee: Texas Instruments Incorporated, Dallas, Tex.

[21] Appl. No.: 372,506

[22] Filed: Jun. 22, 1989

[51] Int. Cl.$^5$ .................. G01R 31/28; G01R 31/02
[52] U.S. Cl. .................. 324/73.1; 324/158 R; 371/22.1; 371/25.1; 371/15.1
[58] Field of Search ............ 324/73 R, 158 R, 73 PC; 371/15.1, 16.1, 22.1, 22.2, 25.1

[56] References Cited

U.S. PATENT DOCUMENTS

| | | | |
|---|---|---|---|
| 3,636,450 | 1/1972 | Griffin | 324/158 T |
| 3,673,397 | 6/1972 | Schaefer | 324/73 PC |
| 3,764,995 | 10/1973 | Helf, Jr. et al. | 324/73.1 |
| 4,397,021 | 8/1983 | Lloyd et al. | 371/15.1 |
| 4,402,055 | 8/1983 | Lloyd et al. | 371/15.1 |
| 4,760,330 | 7/1988 | Lias, Jr. | 324/73 R |
| 4,810,958 | 3/1989 | Mogi et al. | 324/73 R |
| 4,816,750 | 3/1989 | Van der Kloot et al. | 324/73 R |
| 4,929,888 | 5/1990 | Yoshida | 324/158 R |

Primary Examiner—Kenneth Wieder
Assistant Examiner—Vinh P. Nguyen
Attorney, Agent, or Firm—B. Peter Barndt; James T. Comfort; Melvin Sharp

[57] ABSTRACT

A reconfigurable resource architecture enhances a test system's utilization by allowing product-mix dependent allocation of test system resources. The test system resources can be configured to test several device types with different pin counts simultaneously. The configuration can be changed to accommodate various product mixes based on pin count.

31 Claims, 6 Drawing Sheets

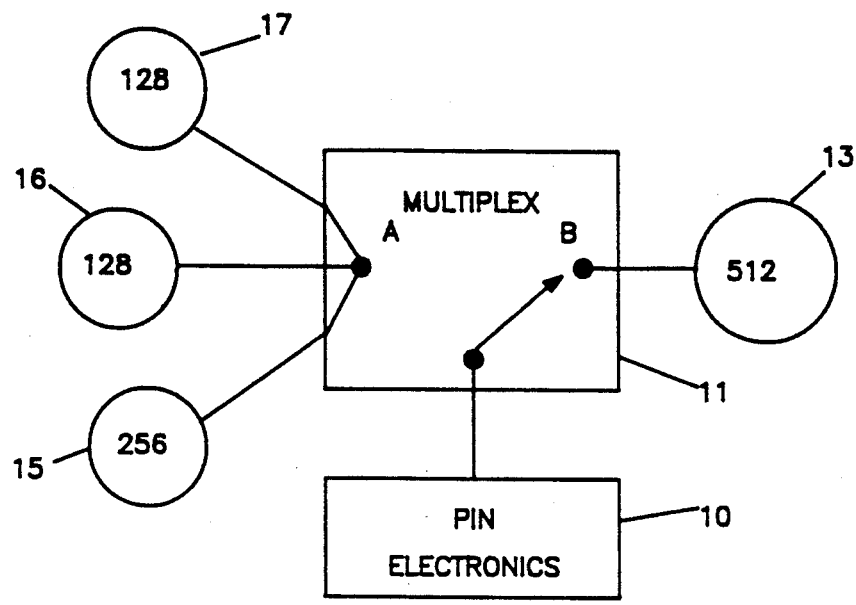
FIGURE 1
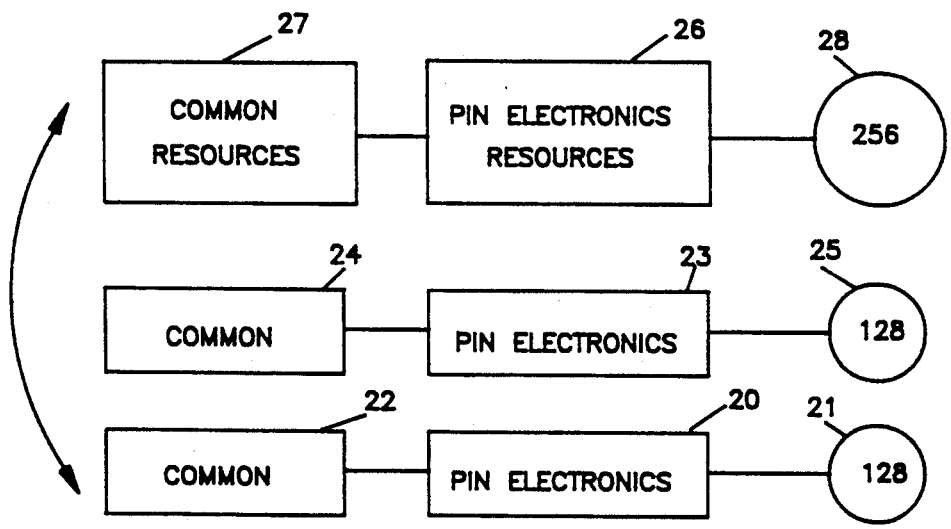
FIGURE 2
| PROGRAMMED DELAYS | | | | |
|---|---|---|---|---|
| CC | AIN TO PSC | BIN TO PSC | OPS TO AOUT | OPS TO BOUT |
| 1A | X | 0 | 0 | X |
| 1B | 12 | 2 | 2 | 12 |
| 3A | 10 | 4 | 4 | 10 |
| 3B | 8 | 6 | 6 | 8 |
| 5A | 6 | 8 | 8 | 6 |
| 5B | 4 | 10 | 10 | 4 |
| 7A | 2 | 12 | 12 | 2 |
| 7B | 0 | X | X | 0 |
FIGURE 9

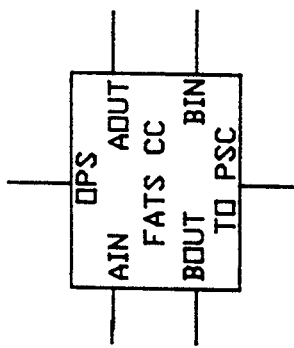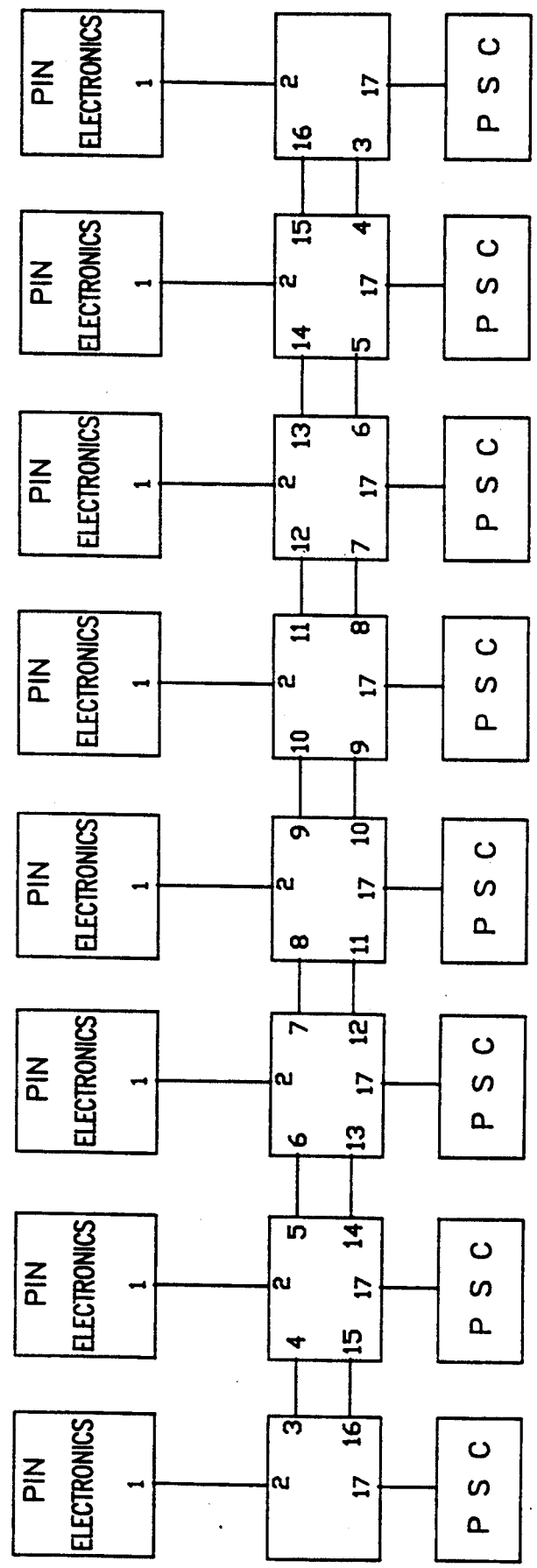
FIGURE 8
FIGURE 7

RECONFIGURABLE ARCHITECTURE FOR LOGIC TEST SYSTEM

FIELD OF THE INVENTION

This invention relates to semiconductor logic test systems and more particularly to a test system with reconfigurable architecture.

BACKGROUND OF THE INVENTION

Testing integrated circuits to ensure their functionality and specification is accomplished with Automatic Test Equipment. As the capability of the integrated circuit improves, it is necessary that the capability of the test equipment improve, driving the cost of such equipment higher. It becomes increasingly more important to maximize the utilization of the equipment to keep the cost of test reasonable.

In testing logic integrated circuits, the number of pins that a tester is capable of testing has a direct impact on the cost of the tester. When purchasing a logic tester, the pin count of the tester is set by the integrated circuit that has the highest pin count.

In the logic integrated circuit business the number of units billed or sold is likely a normal distribution of its relation to pin count. This indicates that although a tester is specified and purchased by the highest pin count integrated circuit to be tested, the tester will be used a relatively small amount of time testing that specific integrated circuit. On the average most of the resources in a tester are not used most of the time. This makes very ineffective use of the high cost test equipment.

It is possible to improve the utilization of this type of test equipment by changing the test system architecture. If a 512 pin VLSI test system is purchased, but used the majority of time to test 128 pin integrated circuits, then 384 of the pins are idle most of the time. If the system were configured to utilize those 384 pins of resources in a way that it could also be testing three more 128 pin integrated circuits, tester utilization would be greatly improved. To achieve optimum improvement it is necessary to be able to test different logic integrated circuit types.

Prior art testers have attempted to solve these testing problems by physically combining smaller test heads into large pin count test heads, but these testers still have only one controller. There cannot be two completely independent test programs as they must time share the controller, as well as divide other common tester resources.

SUMMARY OF THE INVENTION

The invention is a test system for VLSI logic integrated circuits which is configured to provide, for example, up to eight 128 pin groups or slices, reconfigurable to allow partitions of 128, 256, 512, and 1024 pin configurations.

The test system resources can be configured to test several device types with different pin counts simultaneously. The configuration can be changed quickly to accommodate various product mixes based on pin count.

To test up to 1024 pin devices, up to eight independent test program controllers may be associated with up to eight partitions. Test heads are provided that can accommodate 128, 256, 512, and 1024 pin configurations. The program controllers are connected though a switch matrix to common circuitry which, in part, provides synchronization between resource groups. The per pin electronics is connected between the common circuitry and a switch matrix which is connected to the various different pin count test heads.

The eight independent test program controllers are connected to a system configuration manager. Partitionable resources in the test system are achieved by dividing all of the pin resources into pin groups or slices. Each pin group functions independent, or combined with other pin group(s) to supply the appropriate number of pin resources to a selected test head size.

A timing source is used with each pin group and synchronization is used when combining pin group resources. When independent 128 pin resources are combined to reconfigure to a higher pin count test, the combined pin group resources must be synchronized.

Each pin group resource contains a crystal oscillator that can be used as the time base for its own pins as well as the pins for other pin groups. Each pin group resource has a fan-in/fan-out matrix providing equal electrical length distribution of a timing reference or clock to allow pin group-to-group deskew. Each pin group (common electronics) has its own functional test processor. Each pin group also has programmable cycle delays on certain cycle-critical signals to ensure the signals reach each functional test processor on the same clock cycle.

When running two or more pin groups in parallel, all must run at the exact same frequency to prevent them from drifting out of synchronization. One way to ensure that two frequencies are the same is to use a single source. A multiplexing method is used in the present invention to permit each pin group to run off the same oscillator. Each pin group has programmable delays in its timing reference path to compensate for skew.

To ensure that each processor is executing the same instruction on each cycle, the process start signal must reach each processor in a group on the same cycle. To ensure complete start synchronization, each pin group sends and receives signals from the pin group on either side of itself. A programmable number of cycles of delay are inserted into these signals before their use.

The technical advance represented by the invention as well as the objects thereof will become apparent from the following description of a preferred embodiment of the invention when considered in conjunction with the accompanying drawings, and the novel features set forth in the appended claims.

BRIEF DESCRIPTION OF THE DRAWINGS

FIG. 1 is simplified block diagram of the present invention;

FIG. 2 is a block diagram illustrating the reconfigurable resources of the present invention;

FIG. 7 illustrates the synchronization of the tester resources;

FIG. 8 shows the inputs and outputs of a synchronization block of FIG. 7;

FIG. 9 is a table of programmed delays of FIG. 7; and

DESCRIPTION OF A PREFERRED EMBODIMENT OF THE INVENTION

Figure 3:
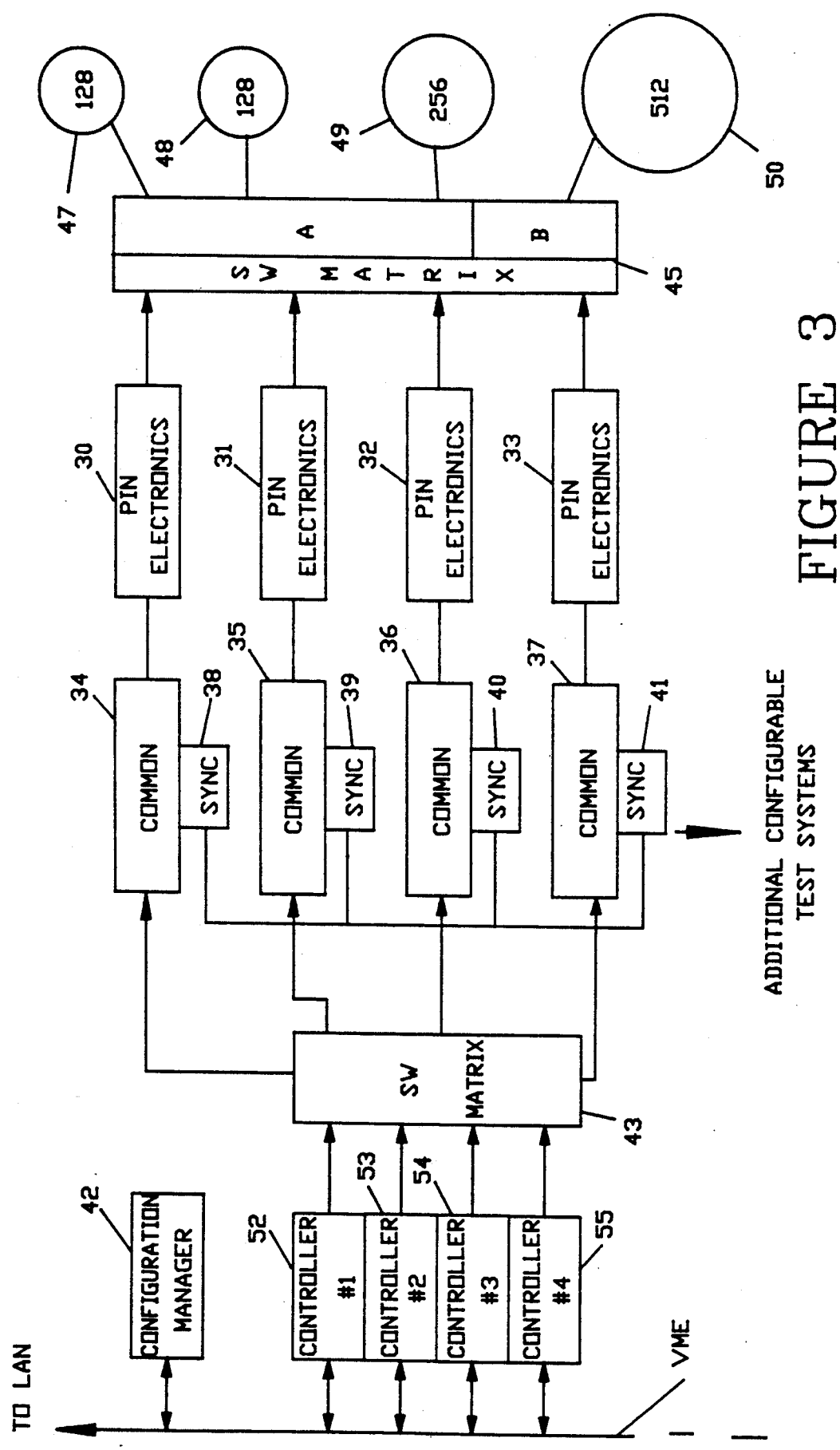
FIG. 3 is a detailed block diagram of the present invention showing four reconfigurable test groups.

FIG. 1 shows four test heads and pin electronics that can be multiplexed between two test head configurations. The test heads provide critical circuitry to interface directly to the device under test, while the pin electronics provide support for the test head circuitry as well as functional and analog stimulus generation and response measurement circuitry. The pin electronics in this example can support testing of up to 512 pins. When the pin electronics is switched to the A side, three different devices can be tested simultaneously and independently on the test heads 15, 16, and 17. The 512 pins of pin electronics in this case is split between two 128 pin and one 256 pin test heads.

Alternately, when the pin electronics is switched to the B side, one device and be tested on a 512 pin test head 13.

Since the test heads in the present invention contain only a very small percentage of the total electronics in the test system, whether the pin electronics are switched to the Side A or side B, the majority of the tester hardware is being utilized.

FIG. 2 is a diagram showing how the overall test system is simplified and uses common parts to provide a reconfigurable test system. In FIG. 2, there are two per pin electronic groups 20 and 23, two 128 pin test heads 21 and 25, and two common electronic units 22 and 24. The two common electronic units 22 and 24 can operate as one common electronic unit 27, the two per pin electronic groups 20 and 23 can operate as one larger per pin electronics group 26 and the two test heads can be replaced with (or switched to) a 256 pin test head 28. In practice there may be two 128 pin test heads and one 256 pin test head connected to per pin electronics 26. In this way two 128 pin devices or one 256 pin device may tested. The per pin electronics unit 26, as illustrated, has the capability of testing up to 256 pins, either on one device or on two different 128 pin devices.

The common electronic units would include, for example, a central timing generator, a pattern sequence controller, and analog test support functions for the device or devices under test.

FIG. 3 is a more detailed diagram of a reconfigurable test system. For example, four independent tester slices or units (test modules) are operated in parallel. While only four units are illustrated, any number, for example eight units, may be operated in parallel to test different or similar devices simultaneously of from 128 to 1024 pin configurations. There are four controllers 52, 53, 54 and 55 connected to a bus, for example a VME bus, that is connected to a configuration manager 42. Configuration manager 42 controls and determines the configuration of the four controllers 52, 53, 54 and 55, and to which common electronics module (34–37) each controller is connected. The configuration manager configures the various test modules to combine some test modules and not others to conduct test on different type devices simultaneously. Controller 52 is connected to a common electronics module 34 through switch matrix 43. Common electronics module 34 includes a synchronization circuit 38, and pin electronics unit 30. The pin electronic unit 30, which includes functional and analog stimulus generation and response measurement circuitry 30a, is connected to switch matrix 45 which has test heads 47, 48, 49 and 50 connected to it.

Controller 53 is connected to a common electronics module 35 through switch matrix 43. Common electric module 35 is also connected to synchronization circuit 39, and pin electronics unit 31 includes functional and analog stimulus generation and response measurement circuitry 31a. Pin electronic unit 31 is connected to switch matrix 45 which has test heads 47, 48, 49 and 50 connected to it.

In a similar manner Controller 54 is connected to a common electronics module 36 through switch matrix 43. Common electronics module 36 is also connected to synchronization circuit 40, and pin electronics unit 32. Per pin electronic unit 32 includes functional and analog stimulus generation and response measurement circuitry 32a connected to switch matrix 45 which has test heads 47, 48, 49 and 50 connected to it.

Controller 55 is connected to a common electronics module 37 through switch matrix 43. Common electronics module 37 is also connected to synchronization circuit 41, and per pin electronics unit 33 includes functional and analog stimulus generation and response measurement circuitry 33a. Per pin electronic unit 33 is connected to switch matrix 45 which has test heads 47, 48, 49 and 50 connected to it.

The four synchronization circuits 38, 39, 40 and 41 are all connected together to provide synchronization between the four systems. The synchronizations circuits are discussed in more detail below.

In one example of operation of the invention, controller 52 is connected to per pin electronics through common 34 and switch matrix 43. Controller 52 is programmed to test a 128 pin device, therefore, the pin electronics 30 is connected to test head 47 through switch matrix 45.

Switch Matrix 45, FIG. 3, has two basic positions, A and B. When Switch Matrix 45 is in the A position it is possible to test three devices. For example: Common Electronics 34 and Pin electronics 30 can be used to test a 128 pin device (test head 47); Common electronics 35 and Pin Electronics 31 can test another 128 pin device (test head 48); and Common electronics 36 and 37, and Pin electronics 32 and 33 can test a 256 pin device (test head 49). When Switch Matrix 45 is in the B position, all Common electronics 34, 35, 36 and 37, along with Pin Electronics 30, 31, 32 and 33 are used to test a 512 pin device using test head 50. Only one controller 52, 53, 54 or 55 is needed for each test program. By utilizing Switch Matrix 43, any controller can be connected to run a test program for any configuration, or if several test heads are being used for different device, then one controller is used for each program. The test system is not limited to a single test program during a specific time frame, but each controller may be conducting tests on different type devices simultaneously, as determined by configuration manager 42. For example, each controller may be testing a different 128 pin device, or controller 52 may be testing a 256 pin device while controllers 54 and 55 are each testing different 128 pin devices.

FIG. 3 shows four controllers, but the test system can be expanded to have, for example, eight controllers. The number of per pin electronic groups, thus the number of pins, can also be expanded to test device with up to 1024 pins. The number of pins is limited only by physical size and cable lengths.

The reconfigurable resource architecture defined by the present invention results in improved utilization and throughput for automated test equipment. The implementation of FIG. 3 involves four independent 128 pin tester slices which can be made to work in synchronization when a larger pin count is desired.

There are three things to be considered in the synchronization method. Each slice (a is slice defined as a 128 pin electronics group) contains a crystal oscillator that can be used as the timing base for its own slice as well as any other slices the user wishes to combine. Each slice has a fan-in/fan-out matrix providing equal electrical length distribution of a timing reference or clock to allow slice-to-slice deskew. Each slice also has programmable cycle delays on certain cycle-critical signals to ensure these signals reach each slice on the same clock cycle. [CLOCK DISTRIBUTION: When running two or more processors of any kind in parallel, all must run off the exactly same frequency clock to prevent them from drifting out of synchronization. For example, a 0.001% error, after 1 million cycles, would result in a slice to slice error of 10 cycles. One way to ensure two frequencies are identical is to use a single source.

Figure 4:
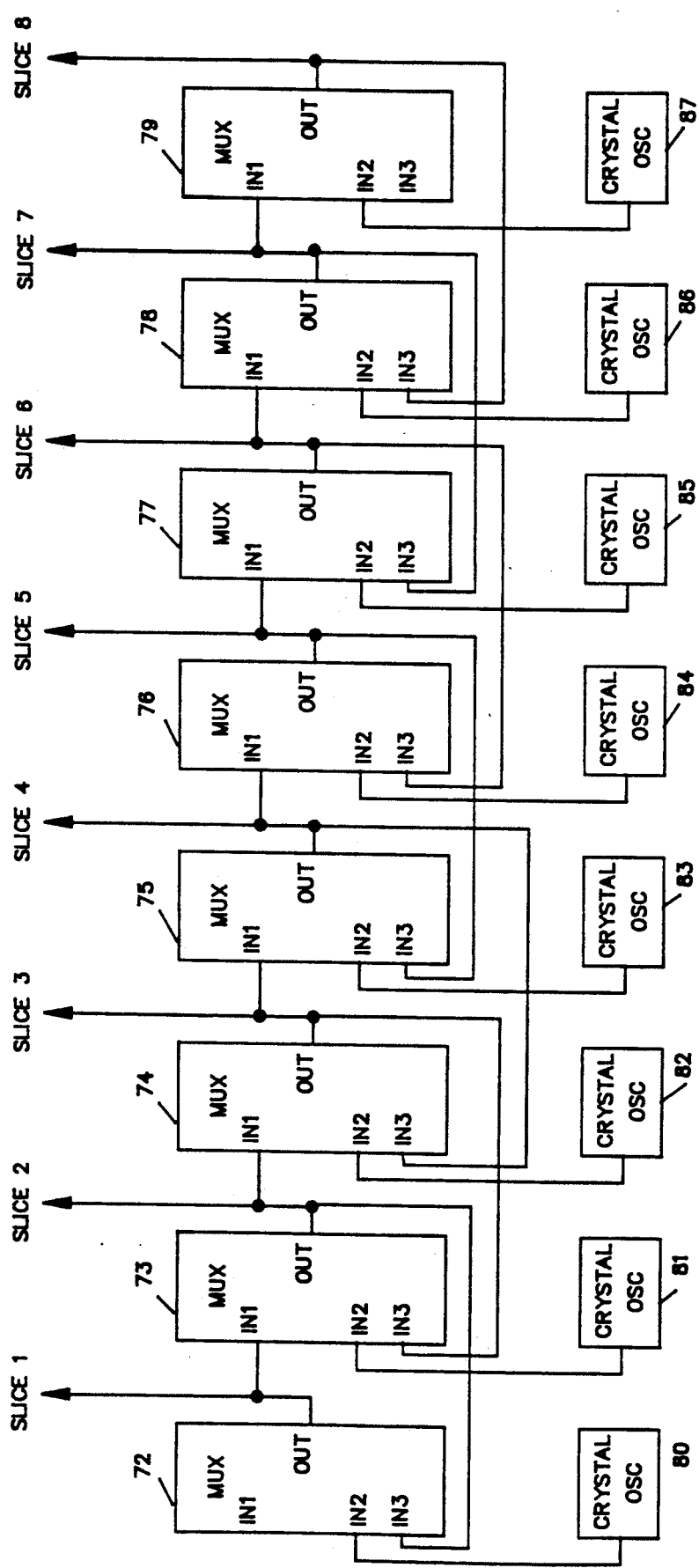
FIG. 4 illustrates clock distribution for the reconfigurable resources.

An example of a multiplexing synchronizing method that may be used in the present invention is illustrated in FIG. 4. This method allows, any contiguous group of slices to run off the same oscillator (any one of oscillator 80-87%) while minimizing the cost by minimizing the number of interslice cables.

FIG. 4 illustrates a clock distribution and synchronization method for eight slices. There are eight crystal oscillators 80-87 used as time base circuits, and eight multiplexing units 72-79, one of each for each slice. Each slice can run off its own oscillator if all multiplexes are programmed to select IN2. All eight slice can run off slice 4 if slices 1, 2, and 3 are programmed to select IN3, slice 4 is programmed to select IN2, and slices 5, 6, 7 and 8 are programmed to select IN1. Slices 1 through 6 can run off slice 3 and slices 7 and 8 off 7 if 1 and 2 select IN3; slice 3 selects IN2; slices 4, 5 and 6 select IN1; slice 7 selects IN2; and slice 8 selects IN1. In this manner, contiguous groups of any number of slices can run off any one oscillator. The method can be expanded from eight to any number of slices. [CLOCK DESKEW: Due to the clock distribution method, and the different propagation delays of chips in each slice, there will be skews between slices. For the slice outputs of a group to occur in synchronization, these skews must be either designed or calibrated out. Because of the high costs and difficulty of designing the skews out, calibration is preferable. Each slice has programmable delays on its clock which compensate for these skews.

To determine what these delays should be, it is necessary to measure each slices's clock relative to the other slices's clocks. Each slice contains a Time Measurement Unit (TMU) allowing measurement of the time between any two signals. One clock from each slice is fanned out to all the slices with a high integrity relay matrix and coaxial cables. Because of the high cost of manufacturing these arrays and cables exactly equal electrical length, they are manufactured to equal physical length. The electrical length differences are then measured at manufacturing time and these values stored on the systems hard disk. By measuring each slices's clock relative to one slices's fanned-out clock, it is possible to determine the skews between the clocks in different slices.

Figure 5:
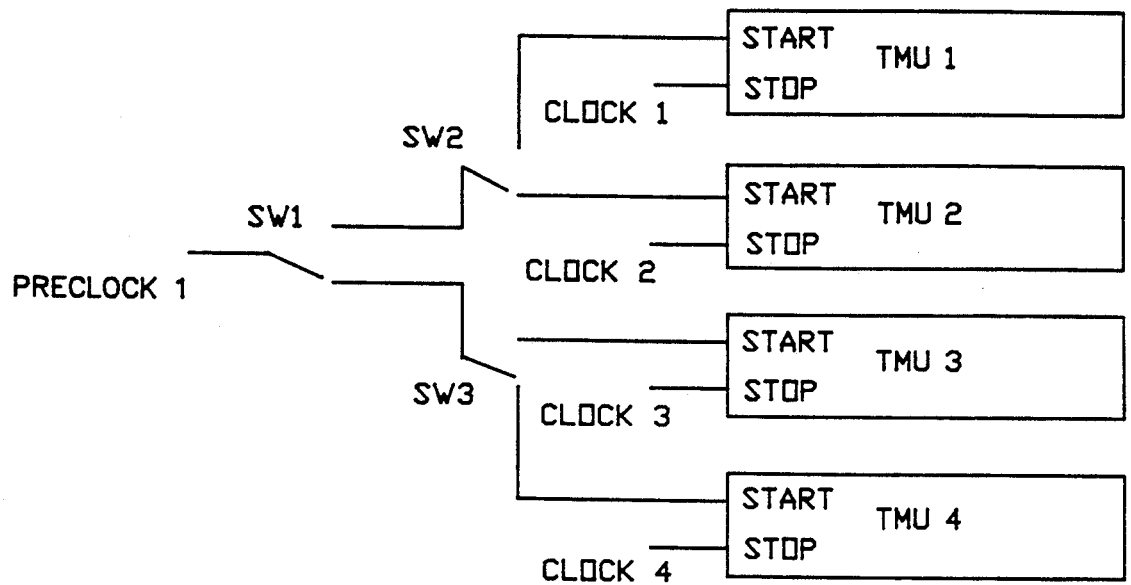
FIG. 5 is a block diagram for measuring clock skew.
Figure 6:
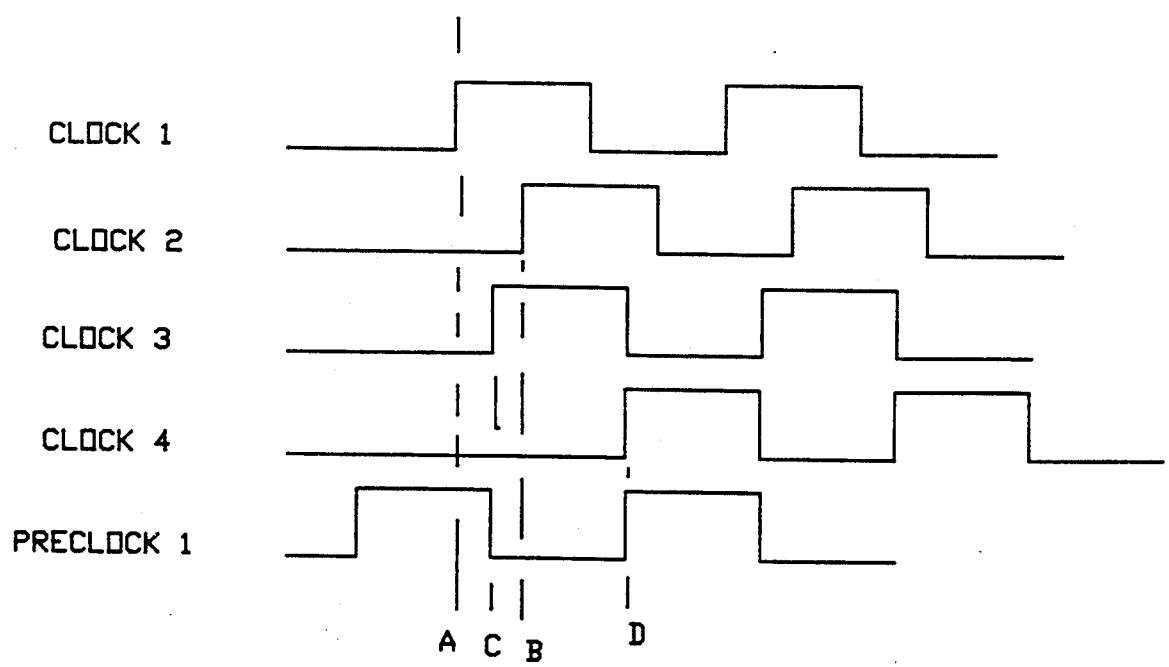
FIG. 6 is a timing diagram of clock skew.

FIG. 5 illustrates the fan-out measurement of the clocks. Switches SW1, SW2 and SW3 are used to switch the reference PRECLOCK1 between the various TMU units. TMU1 measures the fan out delay PRECLOCK1 to CLOCK1. TMU2 measures PRECLOCK1 to CLOCK2 deskew. TMU3 measures PRECLOCK1 to CLOCK3 skew, and TMU4 measures PRECLOCK1 to CLOCK4 skew. FIG. 6 is a timing diagram showing the relative skew between the clocks.

CYCLE-CRITICAL SIGNAL DISTRIBUTION: To ensure each processor is executing the same instruction on each cycle, the processor start signal must reach each processor in a group on the same cycle. Other signals such as condition codes must be collected from each slice in a group and delivered to all processors in the group on the same cycle. A simple way of doing this is for each slice to send these signals to every other slice though equal length cables. This however presents costs and mechanical problems. To overcome the costs and mechanical problems, another method is used. Each slice sends and receives the signals from the slices on either side of it self. A programmable number of cycles of delay are then inserted into the signal paths before their use.

FIG. 7 shows eight synchronization units, 1A, 1B, 3A, 3B, 5A, 5B, 7A and 7B, connected to eight Pattern Sequence Controllers (PSC) and eight per pin electronic slices. These synchronization circuits correspond to the Sync circuits in FIG. 3. These synchronization units keep cycle critical signals such as the FAIL and PSCSTART signals aligned so that they reach all eight slices on the same cycle. This is accomplished by inserting a programmable number of cycles of delay into each signal before sending it out.

FIG. 8 shows the input and output connections for the synchronization units and delays through the units are set forth in FIG. 9.

FIG. 9 list the delays inserted by each slices's synchronization unit with Card Cage 1A (CC1A) being slice 1, CC1B being slice 2, etc.

As an example, the FAIL signal is generated on the Octal Pin Support board (OPS) associated with each slice (Pin Electronics), and passed on to the PSC to halt the processor in case of a device under test failure. Each OPS sends its FAIL to its slices's synchronization unit. Each synchronization unit necessarily inserts two cycles of delay on the FAIL signal, one to clock it in and one to clock it out. For a FAIL signal to propagate from CC1A to CC7B therefore takes 16 cycles. All FAILS must be delayed a total of 16 cycles before reaching the PSCs on the 17th cycle.

The synchronization unit in CC1A sends its OPS FAIL as is to CC1B. CC1A also inserts 14 cycles of delay, combines the FAIL with the FAIL received from CC1B and sends this combined FAIL to PSC1A.

CC1B takes the FAIL received from its OPS, delays it two cycles, combines it with the FAIL from CC1A, and sends it to CC3A. CC1B delays the OPS FAIL twelve cycles, combines it with the FAIL from CC3A and sends it to CC1A. CC1B also delays the FAIL from the OPS 14 cycles, the FAIL form CC1A 12 cycles, the FAIL from CC3A 2 cycles, combines the three FAILS and sends this to PSC1B. All eight synchronization units function in a similar manner so all PSCs see the FAIL signal on the 17th cycle. This same method is used on other cycle-critical signals such as the PSCSTART signal that causes the PSCs to start executing a pattern set.

Figure 10:
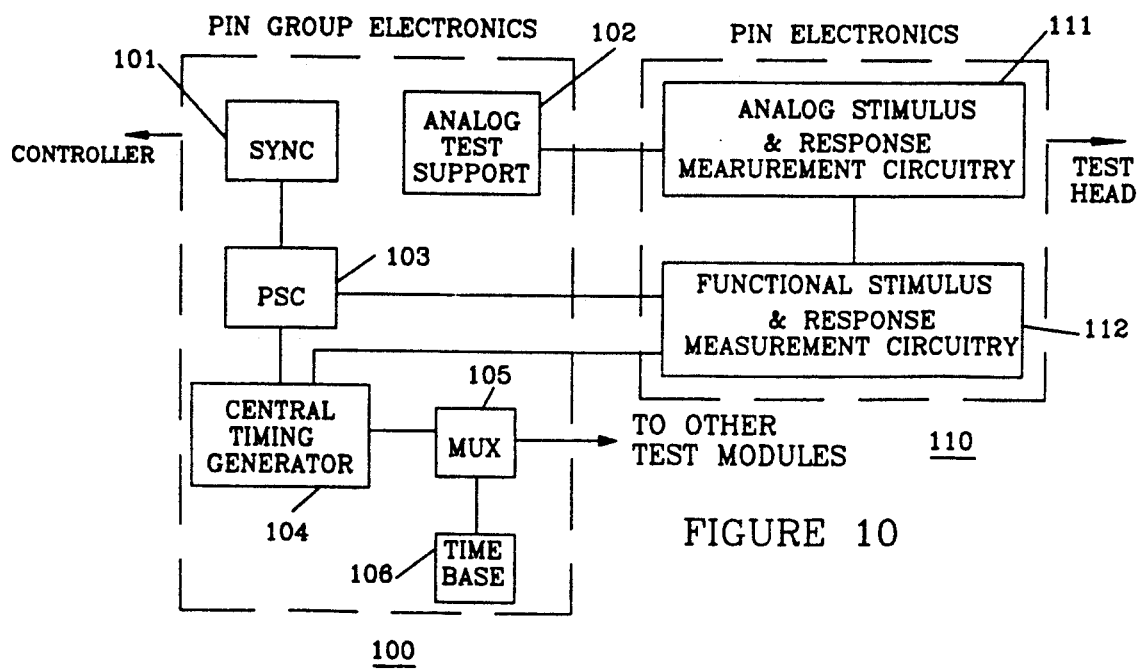
FIG. 10 illustrates more detailed configurations of the Pin Group Electronics and Pin Electronics functions.

FIG. 10 is a more detailed illustration of the Pin Group Electronics and Pin Electronics functions, and combines some of the functions illustrated in FIGS. 3, 4, and 7.

Pin Group Electronics 100, generally illustrated in FIG. 3, for example, as common 34 and Sync 38. These functions also include the multiplexer function (MUX) and timing generator (CRYSTAL OSC) of FIG. 4, and the Sync Unit and PSC of FIGS. 7–8. In FIG. 10, Pin Group Electronics is connected to a controller, for example controller 52, in FIG. 3. Pin Group Electronics 100 includes a Sync unit 101, a PSC (Pattern Sequence Controller) 103, a Central Timing Generator 104, a Time base circuit 106, an analog Test Support circuit 102, and a multiplexer 105. The multiplexer connects the test module of FIG. 10 to other test modules, such as the other three test modules (35,39,31–36,40,32, and 37,41,33) shown in FIG. 3.

The test module of FIG. 10 also includes the Pin Electronics 110. This corresponds to, for example, Pin Electronics 30 of FIG. 3. The Pin Electronics 110 includes the Analog Stimulus and Response Measurement Circuitry function 111 and the Functional Stimulus and Response Measurement Circuitry function 112. The output of the Pin Electronics is to the test head. Several test heads are illustrated in FIG. 3, 47–50.

What is claimed:

1. A reconfigurable logic test system for testing integrated circuits, including at least two test modules, a test module comprising;
    a program controller;
    a first switching matrix;
    a pin group electronic circuit, connected to said program controller by said first switching matrix;
    a pin electronic circuit connected to the pin group electronic circuit;
    a second switching matrix; and
    at least one test head connectable to said pin electronic circuit by said second switching matrix.

2. The reconfigurable logic test system according to claim 1, including a synchronization circuit in said pin group electronic circuit to synchronize operation of said pin group electronic circuit and said pin electronic circuit with other test modules.

3. The reconfigurable logic test system according to claim 1, wherein two or more pin electronic circuits are combined to test integrated circuits having a higher pin count than a single pin electronic circuit has the capability of testing.

4. The reconfigurable logic test system according to claim I, wherein test heads having pin counts of 128, 256, 512 and 1024 are connected to the second switching matrix.

5. The reconfigurable logic test system according to claim 1, wherein each pin group circuit includes a time base circuit which is used for its own pins and for the pins of other pin electronics circuits.

6. The reconfigurable logic test system according to claim 5, including a multiplexing circuit which is used when running a plurality of pin group circuits from the same time base circuit.

7. The reconfigurable logic test system according to claim 5, wherein each time base circuit in each pin electronics circuit has programmable delays to compensate for skew when running a plurality of pin electronic circuits from the same time base.

8. The reconfigurable logic test system according to claim 1, wherein said pin group electronic circuit includes a central timing generator, a pattern sequence controller and functional and analog stimulus generation and response measurement circuitry for devices under test.

9. The reconfigurable logic test system according to claim 1, wherein the test system is configured to combine some test modules and not other test modules to conduct test on different type devices simultaneously.

10. The reconfigurable logic test system according to claim 1, wherein each test module can test a semiconductor device having up to 128 pins.

11. The reconfigurable logic test system according to claim 1, wherein two reconfigurable logic test modules can test a semiconductor device having up to 256 pins.

12. The reconfigurable logic test system according to claim 1, wherein test modules are combined to test semiconductor devices having pin multiples of 128.

13. The reconfigurable logic test system according to claim 1, including a configuration manager for reconfiguring the test system and each test module therein to a selected configuration.

14. The reconfigurable logic test system according to claim 13, wherein the each test module and the configuration manager are connected together on a common bus.

15. A reconfigurable logic test system comprising:
    a plurality of test modules;
    a configuration manager connected to said plurality of test modules along a common bus;
    wherein said configuration manager can configure the test modules to test one or more integrated circuits having different pin counts concurrently.

16. The reconfigurable logic test system according to claim 15, wherein said test modules each includes:
    a program controller;
    a first switching matrix;
    a pin group electronic circuit, connected to said program controller by said first switching matrix;
    a pin electronic circuit connected to the pin group electronic circuit;
    a second switching matrix; and
    at least one test head connectable to said pin electronic circuit by said second switching matrix.

17. The reconfigurable logic test system according to claim 16, including a synchronization circuit in said pin group electronic circuit to synchronize operation of said pin group electronic circuit and said pin electronic circuit with other test modules.

18. The reconfigurable logic test system according to claim 16, wherein two or more pin electronic circuits are combined to test integrated circuits having a higher pin count than a single pin electronic circuit has the capability of testing.

19. The reconfigurable logic test system according to claim 16, wherein test heads having pin counts of 128, 256, 512 and 1024 are connected to the second switching matrix.

20. The reconfigurable logic test system according to claim 16, wherein each pin group electronics circuit includes a time base circuit usable with its own pins and with the pins of other pin electronic circuits.

21. The reconfigurable logic test system according to claim 20, including a multiplexing circuit which is used when running a plurality of pin electronics circuit from the same time base circuit.

22. The reconfigurable logic test system according to claim 20, wherein each time base circuit in each pin electronics circuit has programmable delays to compensate for skew when running a plurality of pin electronic circuits from the same time base.

23. The reconfigurable logic test system according to claim 16, wherein said pin group electronic circuit includes a circuit timing generator, a pattern sequence controller and said pin electronic circuit includes analog test support functions for devices under test.

24. The reconfigurable logic test system according to claim 16, wherein the test system is configured to combine some test modules and not other test modules to conduct test on different type devices simultaneously.

25. The reconfigurable logic test system according to claim 16, wherein each test module can test a semiconductor device having up to 128 pins.

26. The reconfigurable logic test system according to claim 16, wherein two reconfigurable logic test modules can test a semiconductor device having up to 256 pins.

27. The reconfigurable logic test system according to claim 16, wherein test modules are combined to test semiconductor devices having pin multiples of 128.

28. A method of reconfiguring a logic test system to test integrated circuits having a pin count from 128 pins to at least 1024 pins, the test system including a plurality of test modules each having a controller and each having electronic testing and measuring circuits to test 128 pins, comprising the steps of;
combining two or more test modules to provide test resources to test the desired number of pins,
synchronizing the test modules, and programming the combined modules with a single controller from one of the modules.

29. The method according to claim 28, including the step of separating test modules to test a plurality of integrated circuits having a smaller pin count, and also combining test modules to test an integrated circuit of a higher pin count than said smaller pin count.

30. The method according to claim 28 wherein a timing reference is used in synchronizing the test modules, including the step of using the timing reference from one test module of the combined test modules and providing a variable delay so that each test module receives the timing reference at the same time.

31. The method according to claim 28, including the step of multiplexing the combined electronic resources to test an integrated circuit requiring greater electronic resources support than possible with a single test module.

* * * * *